(12) United States Patent
Shibata

(10) Patent No.: US 12,254,396 B2
(45) Date of Patent: Mar. 18, 2025

(54) PRODUCT-SUM CALCULATION UNIT, NEUROMORPHIC DEVICE, AND PRODUCT-SUM CALCULATION METHOD

(71) Applicant: TDK CORPORATION, Tokyo (JP)

(72) Inventor: Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 1030 days.

(21) Appl. No.: 17/279,473

(22) PCT Filed: Sep. 27, 2018

(86) PCT No.: PCT/JP2018/036118
§ 371 (c)(1),
(2) Date: Mar. 24, 2021

(87) PCT Pub. No.: WO2020/065881
PCT Pub. Date: Apr. 2, 2020

(65) Prior Publication Data
US 2022/0004853 A1 Jan. 6, 2022

(51) Int. Cl.
*G06N 20/00* (2019.01)
*G06F 7/50* (2006.01)
(Continued)

(52) U.S. Cl.
CPC .............. *G06N 3/063* (2013.01); *G06F 7/50* (2013.01); *G06F 7/523* (2013.01); *G06F 7/5443* (2013.01); *G11C 11/34* (2013.01)

(58) Field of Classification Search
None
See application file for complete search history.

(56) References Cited

U.S. PATENT DOCUMENTS

| | | | |
|---|---|---|---|
| 9,489,618 | B2 | 11/2016 | Roy et al. |
| 2018/0232635 | A1 | 8/2018 | Oh et al. |
| 2019/0171418 | A1 | 6/2019 | Morie et al. |

FOREIGN PATENT DOCUMENTS

| | | | |
|---|---|---|---|
| JP | 5160304 B2 | 3/2013 | |
| KR | 10-2018-0093245 A | 8/2018 | |

(Continued)

OTHER PUBLICATIONS

Burr et al., "Neuromorphic computing using non-volatile memory," Advances in Physics: X, 2017, vol. 2, No. 1, pp. 89-124.

(Continued)

*Primary Examiner* — David R Vincent
(74) *Attorney, Agent, or Firm* — Oliff PLC

(57) ABSTRACT

A multiply-accumulate calculation device includes: a plurality of first multiple calculation elements configured to generate first output signals by multiplying a first input signal corresponding to an input value by a weight and output the first output signals; and an accumulate calculation unit configured to calculate a sum of the first output signals output from the plurality of first multiple calculation elements in a calculation period from a point in time at which transition to a steady state has occurred after transient responses caused by charging to parasitic capacitors of the plurality of first multiple calculation elements according to input of the first input signal to a point in time after transient responses caused by discharging from the parasitic capacitors of the plurality of first multiple calculation elements according to input of the first input signal have started to be generated.

16 Claims, 5 Drawing Sheets

(51) Int. Cl.
*G06F 7/523* (2006.01)
*G06F 7/544* (2006.01)
*G06N 3/063* (2023.01)
*G11C 11/34* (2006.01)

(56) References Cited

FOREIGN PATENT DOCUMENTS

WO     2017/183575 A1    10/2017
WO     2018/034163 A1    2/2018

OTHER PUBLICATIONS

Dec. 18, 2018 International Search Report issued in International Patent Application No. PCT/JP2018/036118.

PRODUCT-SUM CALCULATION UNIT, NEUROMORPHIC DEVICE, AND PRODUCT-SUM CALCULATION METHOD

TECHNICAL FIELD

The present disclosure relates to a multiply-accumulate calculation device, a neuromorphic device, and a multiply-accumulate calculation method.

BACKGROUND ART

A multiply-accumulate calculation device and a neuromorphic device as devices that execute arithmetic operations of a neural network for realizing artificial intelligence (AI), the Internet of Things (IoT), deep learning, and the like are currently attracting attention.

For example, Non-Patent Literature 1 discloses a method of executing arithmetic operations of a neural network using memristors. A method using perceptrons is widely utilized for arithmetic operations of a neural network. In arithmetic operations of a neural network using perceptrons, calculation of Eax-Fb (b: bias term) is performed. Here, it is desirable that the bias term be adjustable in a wide range from positive to negative values.

CITATION LIST

Non-Patent Literature

[Non-Patent Literature 1]
Geoffrey W. Burr, Robert M. Shelby, Abu Sebastian, Sangbum Kim, Seyoung Kim, Severin Sidler, Kumar Virwani, Masatoshi Ishii, Pritish Narayanan, Alessandro Fumarola, Lucas L. Sanches, Irem Boybat, Manuel Le Gallo, Kibong Moon, Jiyoo Woo, Hyunsang Hwang & Yusuf Leblebici, Advances in Physics: X, 2, 89 (2017)

SUMMARY OF INVENTION

Technical Problem

However, in a case where a negative bias needs to be generated in execution of arithmetic operation of a neural network, circuit configurations of a multiply-accumulate calculation device and a neuromorphic device become complicated.

Accordingly, an object of the present disclosure is to provide a multiply-accumulate calculation device, a neuromorphic device, and a multiply-accumulate calculation method capable of adjusting a bias in a wide range from positive to negative values without causing a complicated circuit configuration.

Solution to Problem

One aspect of the present disclosure is a multiply-accumulate calculation device including: a plurality of first multiple calculation elements configured to generate first output signals by multiplying a first input signal corresponding to an input value by a weight and output the first output signals; and an accumulate calculation unit configured to calculate a sum of the first output signals output from the plurality of first multiple calculation elements in a calculation period from a point in time at which transition to a steady state has occurred after transient responses caused by charging to parasitic capacitors of the plurality of first multiple calculation elements according to input of the first input signal to a point in time after transient responses caused by discharging from the parasitic capacitors of the plurality of first multiple calculation elements according to input of the first input signal have started to be generated.

Furthermore, in one aspect of the present disclosure, each of the plurality of first multiple calculation elements is a variable resistance element having a write terminal, a common terminal, and a read terminal.

Furthermore, in one aspect of the present disclosure, each of the plurality of first multiple calculation elements is a tunnel magnetoresistance effect element.

Furthermore, one aspect of the present disclosure is the multiply-accumulate calculation device further including at least one second multiple calculation element configured to generates a second output signal by multiplying a second input signal by a weight and outputs the second output signal, wherein the accumulate calculation unit is configured to calculate a sum of the first output signals output from the plurality of first multiple calculation elements and the second output signal output from the at least one second multiple calculation element in the calculation period.

Furthermore, one aspect of the present disclosure is the multiply-accumulate calculation device further including a resistor which receives a third input signal and outputs a third output signal to the accumulate calculation unit on the basis of the third input signal, wherein the accumulate calculation unit is configured to calculate a sum of the first output signals output from the plurality of first multiple calculation elements, the second output signal output from the at least one second multiple calculation element, and the third output signal output from the resistor in the calculation period.

Furthermore, one aspect of the present disclosure is the multiply-accumulate calculation device further including: at least one second multiple calculation element configured to generates a second output signal by multiplying a second input signal used to generate a positive bias by a weight and outputs the second output signal; and a resistor which receives a third input signal and outputs a third output signal to the accumulate calculation unit on the basis of the third input signal, wherein the accumulate calculation unit is configured to calculate a sum of the first output signals output from the plurality of first multiple calculation elements, the second output signals output from the plurality of second multiple calculation elements, and the second output signal output from the at least one second multiple calculation element.

Furthermore, one aspect of the present disclosure is a neuromorphic device including any one of the aforementioned multiply-accumulate calculation devices.

Furthermore, one aspect of the present disclosure is a multiply-accumulate calculation method of any one of the aforementioned multiply-accumulate calculation devices, including: a multiple calculation process in which the plurality of first multiple calculation elements generate the first output signals by multiplying the first input signal by a weight and output the first output signals; and an accumulate calculation process in which the accumulate calculation unit calculates a sum of the first output signals output from the plurality of first multiple calculation elements in the calculation period from a point in time at which transition to a steady state has occurred after transient responses caused by charging to the parasitic capacitors of the plurality of first multiple calculation elements according to input of the first input signal to a point in time after transient responses caused by discharging from the parasitic capacitors of the plurality of first multiple calculation elements according to input of the first input signal have started to be generated.

Advantageous Effects of Invention

According to the above-described multiply-accumulate calculation device, neuromorphic device, and multiply-accumulate calculation method, it is possible to provide a multiply-accumulate calculation device, a neuromorphic device, and a multiply-accumulate calculation method capable of adjusting a bias in a wide range from positive to negative values without causing a complicated circuit configuration.

DESCRIPTION OF EMBODIMENTS

Figure 1:
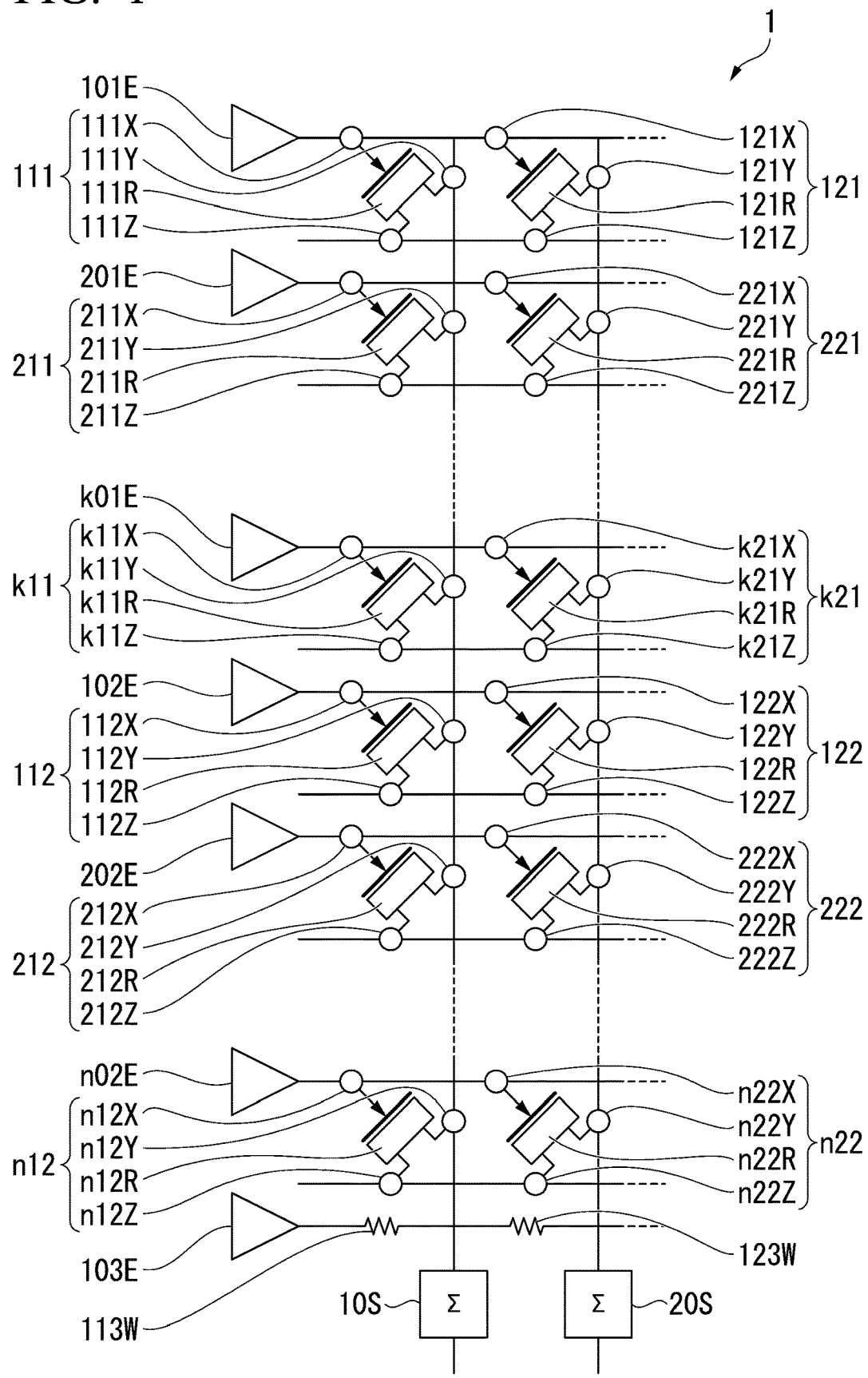
FIG. 1 is a diagram illustrating an example of a configuration of a part of a multiply-accumulate calculation device according to an embodiment.
Figure 2:
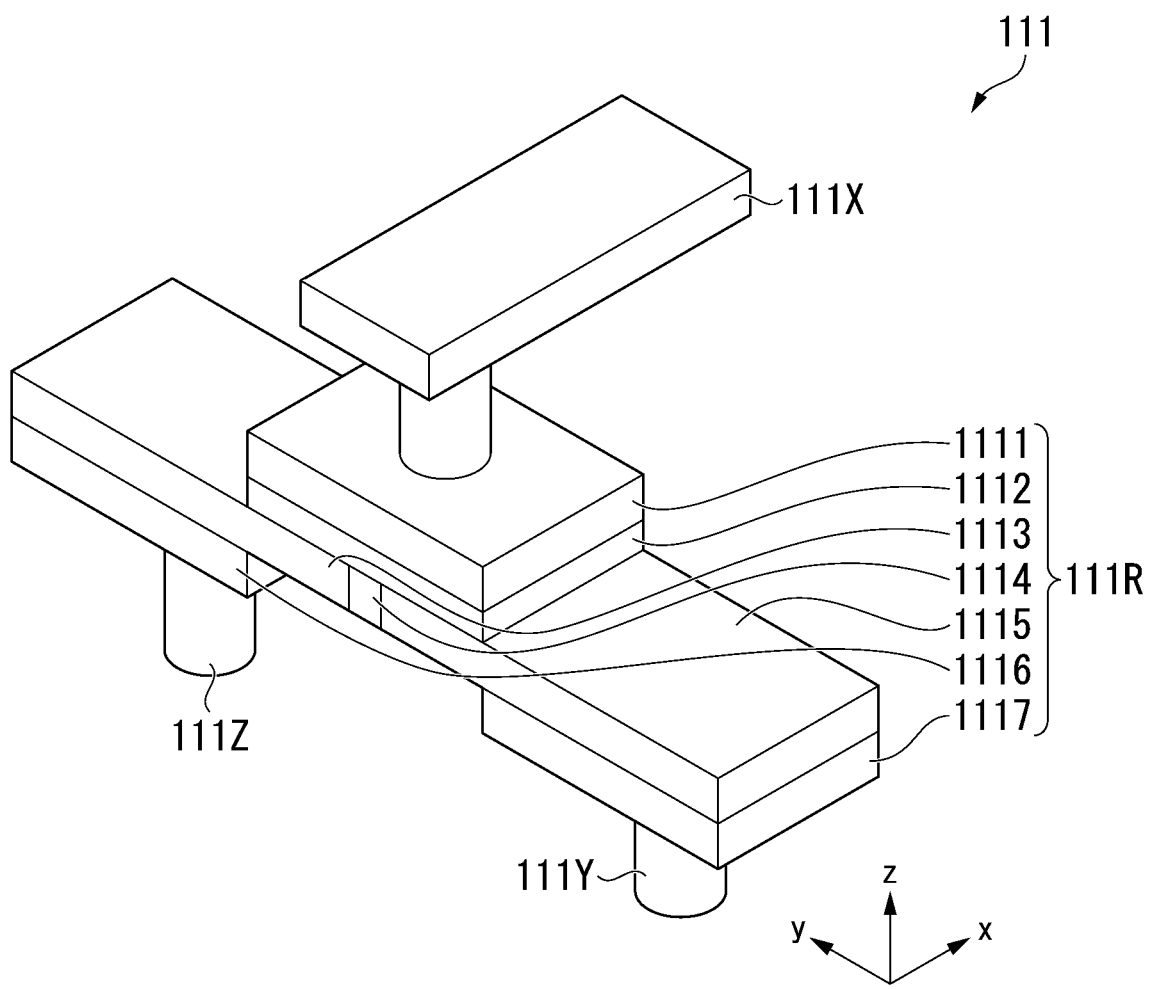
FIG. 2 is a diagram illustrating an example of a variable resistance element according to an embodiment.

An example of a configuration of a multiply-accumulate calculation device according to an embodiment will be described with reference to FIG. 1 and FIG. 2. FIG. 1 is a diagram illustrating an example of a configuration of a part of the multiply-accumulate calculation device according to an embodiment. FIG. 2 is a diagram illustrating an example of a variable resistance element according to an embodiment.

As illustrated in FIG. 1, the multiply-accumulate calculation device 1 includes first input units 101E, 201E, . . . , k01E, first multiple calculation elements 111, 121, 211, 221, . . . , k11, and k21, second input units 102E, 202E, . . . , n02E, second multiple calculation elements 112, 122, 212, 222, . . . , n12, and n22, a third input unit 103E, resistors 113W and 123W, and accumulate calculation units 10S and 20S.

The first multiple calculation element 111 may be a variable resistance element having a parasitic capacitor, for example, a phase-change memory (PCM), a resistive random access memory (ReRAM), or a magnetoresistance effect element illustrated in FIG. 2. As illustrated in FIG. 1 and FIG. 2, the first multiple calculation element 111 includes a variable resistor 111R, a read terminal 111X, a common terminal 111Y, and a write terminal 111Z. In addition, the first multiple calculation elements 121, 211, 221, k11, and k21 are variable resistance elements, for example, magnetoresistance effect elements the same as that illustrated in FIG. 2, and respectively include variable resistors 121R, 211R, 221R, . . . , k11R, and k21R, read terminals 121X, 211X, 221X, . . . , k11X, and k21X, common terminals 121Y, 211Y, 221Y, . . . , ki1Y, and k21Y, and write terminals 121Z, 211Z, 221Z, . . . , k11Z, and k21Z.

Here, the variable resistor 111R included in the first multiple calculation element 111 may include, for example, a magnetization fixed layer 1111, a nonmagnetic layer 1112, a first region 1113, a magnetic domain wall 1114, a second region 1115, a first magnetization supply layer 1116, and a second magnetization supply layer 1117, as illustrated in FIG. 2. Hereinafter, the x axis, the y axis, and the z axis illustrated in FIG. 2 will be used in description using FIG. 2. The x axis, the y axis, and the z axis form three-dimensional rectangular coordinates of a right-handed system. The magnetization fixed layer 1111, the nonmagnetic layer 1112, the first region 1113, the second region 1115, the first magnetization supply layer 1116, and the second magnetization supply layer 1117 are formed in thin rectangular parallelepiped shapes, and a surface having a maximum area is parallel to an xy plane.

The magnetization fixed layer 1111 has a magnetization direction fixed in a +y direction. Here, fixing of magnetization means that a magnetization direction does not change between before and after writing using a write current. In addition, the magnetization fixed layer 1111 may be, for example, an in-plane magnetization film having in-plane magnetic anisotropy or a perpendicular magnetization film having perpendicular magnetic anisotropy.

A surface of the nonmagnetic layer 1112 facing a +z direction and having a maximum area is in contact with a surface of the magnetization fixed layer 1111 facing a −z direction. Although the surface of the magnetization fixed layer 1111 facing a z direction and the surface of the nonmagnetic layer 1112 facing the z direction may not have the same shape and area, the nonmagnetic layer 1112 may extend to cover the first region 1113 and the second region 1115 and be larger than the magnetization fixed layer 1111. In addition, the nonmagnetic layer 1112 is used for the first multiple calculation element 111 to read change in a magnetization state of a magnetization free layer with respect to the magnetization fixed layer 1111 as change in a resistance value.

The first region 1113, the magnetic domain wall 1114, and the second region 1115 form a magnetization free layer. The magnetization free layer is formed of a ferromagnetic material and can reverse a magnetization direction. The first region 1113 has a magnetization direction fixed in the +y direction, and a specific region thereof on the side in a −y direction in a surface facing the +z direction is in contact with the surface of the nonmagnetic layer 1112 facing the −z direction. On the other hand, the second region 1115 has a magnetization direction fixed in the −y direction, and a specific region thereof on the side in the +y direction in a surface facing the +z direction is in contact with the surface of the nonmagnetic layer 1112 facing the −z direction. The magnetic domain wall 1114 is sandwiched between the first region 1113 and the second region 1115 in the y direction.

It is desirable that the first magnetization supply layer 1116 do not overlap the magnetization fixed layer 1111 in the z direction, and the surface thereof facing the +z direction is in contact with the surface of the first region 1113 facing the −z direction. In addition, the first magnetization supply layer 1116 has a function of fixing a magnetization direction of a range of the first region 1113 which overlaps the first magnetization supply layer 1116 to a desired direction. Further, the write terminal 111Z is connected to the surface of the first magnetization supply layer 1116 facing the −z direction. Meanwhile, the first magnetization supply layer 1116 may be formed of, for example, the same ferromagnetic material as that available for the magnetization fixed layer 1111, an antiferromagnetic substance such as IrMn, and a ferromagnetic material including a nonmagnetic interlayer, such as Ru and Ir, and may have a synthetic antiferromagnetic structure including a nonmagnetic substance and a ferromagnetic substance.

The second magnetization supply layer 1117 does not overlap the magnetization fixed layer 1111 in the z direction, and the surface thereof facing the +z direction is in contact with the surface of the second region 1115 facing the −z direction. In addition, the second magnetization supply layer 1117 has a function of fixing a magnetization direction of a range of the second region 1115 which overlaps the second magnetization supply layer 1117 to a desired direction. Further, the common terminal 111Y is connected to the surface of the second magnetization supply layer 1117 facing the −z direction. Meanwhile, the second magnetization supply layer 1117 may be formed of, for example, the same ferromagnetic material as that available for the magnetization fixed layer 1111, an antiferromagnetic substance such as IrMn, and a ferromagnetic material including a nonmagnetic interlayer, such as Ru and Ir, and may have a synthetic antiferromagnetic structure including a nonmagnetic substance and a ferromagnetic substance.

The first multiple calculation element 111 changes the position of the magnetic domain wall 1114 in the y direction by adjusting the magnitude and duration of a write current flowing between the common terminal 111Y and the write terminal 111Z. Accordingly, the first multiple calculation element 111 can continuously change a ratio of the area of a region having a parallel magnetization direction to the area of a region having an antiparallel magnetization direction and change the resistance value of the variable resistor 111R approximately linearly. Here, the region having a parallel magnetization direction is the area of a part of the first region 1113 which overlaps the magnetization fixed layer 1111 in the z direction. In addition, the region having an antiparallel magnetization direction is the area of a part of the second region 1115 which overlaps the magnetization fixed layer 1111 in the z direction. Further, the magnitude and duration of the write current are adjusted by at least one of the number of current pulses and a current pulse width.

Meanwhile, the first multiple calculation element 111 may be a tunnel magnetoresistance effect element. The tunnel magnetoresistance effect element includes a magnetization fixed layer, a magnetization free layer, and a tunnel barrier layer as a nonmagnetic layer. The magnetization fixed layer and the magnetization free layer are formed of a ferromagnetic material and have magnetization. The tunnel barrier layer is sandwiched between the magnetization fixed layer and the magnetization free layer. The tunnel magnetoresistance effect element can change a resistance value by changing a relation between the magnetization of the magnetization fixed layer and the magnetization of the magnetization free layer. A known material can be used for a tunnel barrier layer. For example, $Al_2O_3$, $SiO_2$, MgO, $MgAl_2O_4$, or the like can be used as the material. Further, a material including Zn, Be, or the like replacing some of Al, Si, or Mg may be used for the tunnel barrier layer.

Referring back to FIG. 1, a first input signal corresponding to an input value is input from the first input unit 101E to the read terminals 111X and 121X. Likewise, a first input signal corresponding to an input value is input from the first input unit 201E to the read terminals 211X and 221X illustrated in FIG. 1, and a first input signal corresponding to an input value is input from the first input unit k01E to the read terminals k11X and k21X. Pulse width modulation (PWM) in response to the input values is performed on these first input signals.

In addition, a write current for adjusting the resistance values of the variable resistors 111R and 121R is input to the write terminals 111Z and 121Z. Likewise, a write current for adjusting the resistance values of the variable resistors 211R and 221R is input to the write terminals 211Z and 221Z illustrated in FIG. 1, and a write current for adjusting the resistance values of the variable resistors k11R and k21R is input to the write terminals k11Z and k21Z.

The first multiple calculation element 111 generates a first output signal by multiplying the first input signal corresponding to the input value by a weight and outputs the first output signal. That is, the first multiple calculation element 111 generates the first output signal by executing a multiple calculation on the first input signal input to the read terminal 111X using the resistance value of the variable resistor 111R as a weight and outputs the first output signal through the common terminal 111Y. Likewise, the first multiple calculation elements 121, 211, 221, . . . , k11, and k21 generate first output signals by multiplying the first input signals corresponding to the input values by weights and output the first output signals, respectively.

The second multiple calculation element 112 is the same variable resistance element as the first multiple calculation elements 111, 121, 211, 221, . . . , k11, and k21 and includes a variable resistor 112R, a read terminal 112X, a common terminal 112Y, and a write terminal 112Z. In addition, the second multiple calculation elements 122, 212, 222, . . . , n12, and n22 are the same variable resistance elements as the second multiple calculation element 112 and respectively include variable resistor 122R, 212R, 222R, . . . , n12R, and n22R, read terminals 122X, 212X, 222X, . . . , n12X, and n22X, common terminals 122Y, 212Y, 222Y, . . . , n12Y, and n22Y, and write terminals 122Z, 212Z, 222Z, . . . , n12Z, and n22Z.

A second input signal corresponding to a set value is input from the second input unit 102E to the read terminals 112X and 122X. Likewise, a second input signal corresponding to a set value is input from the second input unit 202E to the read terminals 212X and 222X illustrated in FIG. 1 and a second input signal corresponding to a set value is input from the second input unit n02E to the read terminals n12X and n22X. These second input signals include signals having waveforms necessary for the second multiple calculation elements 112, 122, 212, 222, . . . , n12, and n22 to generate desired positive biases.

The second multiple calculation element 112 generates a second output signal by multiplying the second input signal by a weight and outputs the second output signal. That is, the second multiple calculation element 112 generates the second output signal by executing a multiple calculation on the second input signal input to the read terminal 112X using the resistance value of the variable resistor 112R as a weight and outputs the second output signal through the common terminal 112Y. The second input signal differs from the first input signal corresponding to an input value and is a signal having a specific waveform because it is used to generate a positive bias. Likewise, the second multiple calculation elements 122, 212, 222, . . . , n12, and n22 generate second output signals by multiplying the second input signals by weights and output the second output signals.

The resistor 113W receives a third input signal and outputs a third output signal to the accumulate calculation unit 10S on the basis of the third input signal. Likewise, the resistor 123W receives a third input signal and outputs a third output signal to the accumulate calculation unit 20S on the basis of the third input signal. In addition, these third input signals include signals having waveforms necessary for the resistor 113W and the resistor 123W to respectively generate desired positive biases and are input through the third input unit 103E.

In addition, the resistor 113W and the resistor 123W do not have parasitic capacitors differently from the second multiple calculation elements 112, 122, 212, 222, ..., n12, and n22 and thus cannot cause transient responses caused by discharging from parasitic capacitors to be generated. Accordingly, the resistor 113W can cause a positive bias having an absolute value greater than the sum of positive biases generated by the second multiple calculation elements 112, 212, ..., n12 to be generated by causing a desired third input signal to input. In addition, this equally applies to the resistor 123W.

The accumulate calculation unit 10S calculates the sum of the first output signals output from the first multiple calculation elements 111, 211, ..., k11, the second output signals output from the second multiple calculation elements 112, 212, ..., n12, and the third output signal output from the resistor 113W. Likewise, the accumulate calculation unit 20S calculates the sum of the first output signals output from the first multiple calculation elements 121, 221, ..., k21, the second output signals output from the second multiple calculation elements 122, 222, ..., n22, and the third output signal output from the resistor 123W. However, the accumulate calculation unit 10S and 20S may calculate the sum of the first input signals and the second input signals or the sum of the first input signals and the third input signal.

Figure 3:
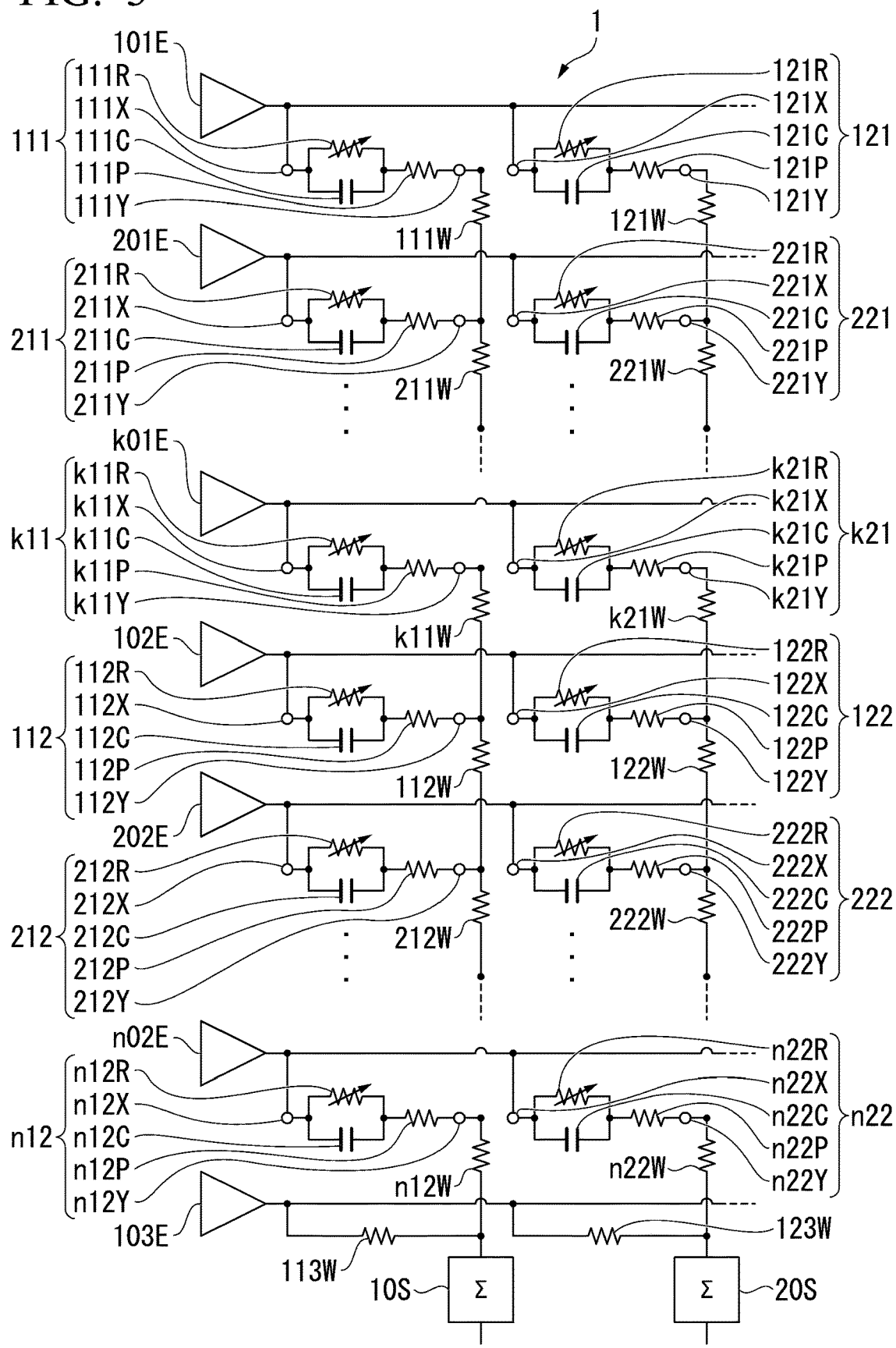
FIG. 3 is a diagram illustrating an example of an equivalent circuit of a configuration of a part of the multiply-accumulate calculation device according to an embodiment.

Next, an example of a method of calculating a sum using the multiply-accumulate calculation device according to an embodiment will be described with reference to FIG. 3 and FIG. 4. FIG. 3 is a diagram illustrating an example of an equivalent circuit of a configuration of a part of the multiply-accumulate calculation device according to an embodiment.

As illustrated in FIG. 3, it can be conceived that the first multiple calculation element 111 includes a parasitic capacitor 111C and a parasitic resistor 111P, the parasitic capacitor 111C is connected in parallel to the variable resistor 111R, and the parasitic resistor 111P is serially connected to the variable resistor 111R. Likewise, the first multiple calculation elements 121, 211, 221, ..., k11, and k21 respectively include parasitic capacitors 121C, 211C, 221C, ..., k11C, and k21C and parasitic resistors 121P, 211P, 221P, ..., k11P, and k21P. Further, it can be conceived that wiring resistors 111W, 121W, 211W, 221W, ..., kl1W, and k21W are serially connected to the first multiple calculation elements 111, 121, 211, 221, ..., k11, and k21, respectively.

Figure 4:
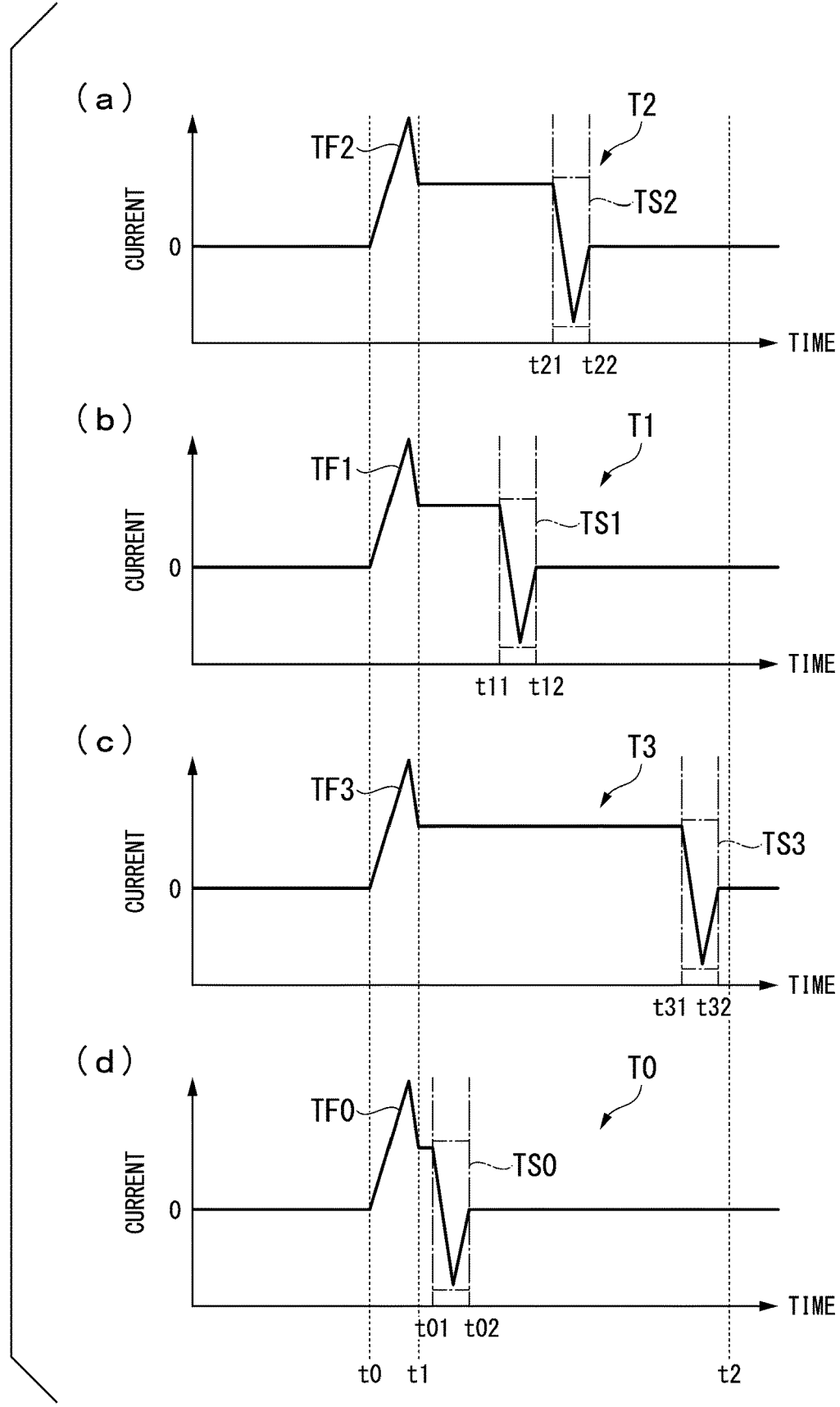
FIG. 4 is a diagram illustrating an example of first output signals output from first multiple calculation elements in response to input of a first input signal corresponding to an input value according to an embodiment.

FIG. 4 is a diagram illustrating examples of first output signals output from a first multiple calculation element in response to input of first input signals corresponding to input values according to an embodiment. Although the first multiple calculation element 111 is exemplified in description using FIG. 4, the same applies to the first multiple calculation units 121, 211, 221, ..., k11, and k21.

FIG. 4(a) illustrates an example of a first output signal T2 in a case where a first input signal corresponding to an input value "2" has been input. The first output signal T2 includes a transient response TF2 and a transient response TS2.

The transient response TF2 is caused by charging to the parasitic capacitor 111C, starts to be generated at a point in time at which input of the first input signal to the first multiple calculation element 111 starts, and transits to a steady state after an elapse of predetermined time. For example, the point in time at which input of the first input signal starts, mentioned here, is a time t0 illustrated in FIG. 4. In addition, the transient response TF2 transits to the steady state at a time t1 illustrated in FIG. 4. Further, a peak height of the transient response TF2 and a duration in which the transient response TF2 is generated depend on the capacitance of the parasitic capacitor 111C.

On the other hand, the transient response TS2 is caused by discharging from the parasitic capacitor 111C, starts to be generated at a point in time at which input of the first input signal to the first multiple calculation element 111 ends, and transits to a steady state after an elapse of predetermined time. For example, the point in time at which input of the first input signal ends, mentioned here, is a time t21 illustrated in FIG. 4(a). In addition, the transient response TS2 transits to the steady state at a time t22 illustrated in FIG. 4(a). Further, a peak height of the transient response TS2 and a duration in which the transient response TS2 is generated depend on the capacitance of the parasitic capacitor 111C. In addition, a period from the time t1 to the time t21 is a length corresponding to the input value "2."

Likewise, FIG. 4(b), FIG. 4(c), and FIG. 4(d) illustrate examples of first output signals T1, T3, and T0 in a case where first input signals respectively corresponding to input values "1," "3," and "0" are input. The first output signals T1, T3, and T0 respectively include transient responses TF1, TF3, and TF0 caused by charging to the parasitic capacitor 111C and transient responses TS1, TS3, and TS0 caused by discharging from the parasitic capacitor 111C. In addition, all the transient responses TF1, TF3, and TF0 start to be generated at the time t0 illustrated in FIG. 4 and transit to a steady state at the time t1 illustrated in FIG. 4. Further, peak heights of the transient responses TF1, TF3, and TF0 and durations in which the transient responses TF1, TF3, and TF0 are generated depend on capacitance of the parasitic capacitor 111C.

Meanwhile, the transient responses TS1, TS3, and TS0 start to be generated at a time t11 illustrated FIG. 4(b), a time t31 illustrated in FIG. 4(c), and a time t01 illustrated in FIG. 4(d) according to ending of input of the first input signals, respectively. In addition, the transient responses TS1, TS3, and TS0 transit to a steady state at a time t12 illustrated FIG. 4(b), a time t32 illustrated in FIG. 4(c), and a time t02 illustrated in FIG. 4(d), respectively. Further, peak heights of the transient responses TS1, TS3, and TS0 and durations in which the transient responses TS1, TS3, and TS0 are generated depend on capacitance of the parasitic capacitor 111C. In addition, a period from the time t1 to the time t11, a period from the time t1 to the time t31, and a period from the time t1 to time t01 are lengths corresponding to the input values "1," "3," and "0," respectively.

In addition, transition of all the transient responses TS2, TS1, TS3, and TS0 to the steady state is completed at a time t2, as illustrated in FIG. 4.

The accumulate calculation unit 10S calculates the sum of first output signals output from the first multiple calculation element 111 in a calculation period from a point in time at which transition to a steady state has occurred after transient responses caused by charging to the parasitic capacitors 111C, 211C, ..., k11C of the first multiple calculation elements 111, 211, ..., k11 according to input of a first input signal to a point in time after transient responses caused by discharging from the parasitic capacitors 111C, 211C, ..., k11C of the first multiple calculation elements 111, 211, ..., k11 according to input of the first input signal have started to be generated. In addition, this equally applies to the accumulate calculation unit 20S.

For example, the point in time at which transition to a steady state has occurred after transient responses caused by charging, mentioned here, is the time t1 illustrated in FIG. 4. In addition, the point in time after transient responses caused by discharging have started to be generated, mentioned here, is a point in time in a period in which a corresponding transient response is generated or a point in time at which transition to the steady state has occurred after the corresponding transient response. For example, a period in which the transient response TS2 caused by discharging is generated is a period from the time t21 to the time t22. In addition, a point in time at which transition to the steady state has occurred after the transient response TS2 caused by discharging is a point in time after the time t22.

In addition, the calculation period mentioned here refers to a point in time at which all transient responses caused by discharging, generated according to input of first input signals corresponding to a plurality of input values, have transited to the steady state, for example, a period from the time t1 to the time t2. The multiply-accumulate calculation device 1 supplies the first output signals T2, T1, T3, and T0 to the accumulate calculation unit 10S only in the calculation period and calculate the sum of the first output signals in the calculation period by using a switch, for example.

The multiply-accumulate calculation device 1 can generate negative charge corresponding to a negative bias because the accumulate calculation units 10S and 20S include at least a part of the transient responses TS2, TS1, TS3, and TS0 caused by discharging in the calculation period. Particularly, the first input units 101E, 201E, ..., kO1 E input first input signals such that the transient response TF0 caused by charging and the transient response TS0 caused by discharging are generated even when a first input signal corresponding to an input value "0" is input. Accordingly, the multiply-accumulate calculation device 1 can generate an always constant negative bias even in a case where the first input signal corresponding to the input value "0" has been input to the first multiple calculation elements 111, 121, 211, 221, ..., k11, and k21.

Referring back to FIG. 3, it can be conceived that the second multiple calculation element 112 includes a parasitic capacitor 112C and a parasitic resistor 112P, the parasitic capacitor 112C is connected in parallel to the variable resistor 112R, and the parasitic resistor 112P is serially connected to the variable resistor 112R. Likewise, the second multiple calculation elements 122, 212, 222, ..., n12, and n22 respectively include parasitic capacitors 122C, 212C, 222C, ..., n12C, and n22C and parasitic resistors 122P, 212P, 222P, ..., n12P, and n22P. Further, it can be conceived that wiring resistors 112W, 122W, 212W, 222W, ..., n12W, and n22W are serially connected to the second multiple calculation elements 112, 122, 212, 222, ..., n12, and n22, respectively.

The second multiple calculation elements 112, 122, 212, 222, ..., n12, and n22 are used to generate positive charge corresponding to positive biases on the basis of second input signals. These positive biases are used to adjust a bias by being added to negative biases generated by the first multiple calculation elements 111, 121, 211, 221, ..., k11, and k21 and the second multiple calculation elements 112, 122, 212, 222, ..., n12, and n22.

The resistor 113W and the resistor 123W are used to generate positive charge corresponding to positive biases on the basis of third input signals. These positive biases are used to adjust a bias by being added to negative biases generated by the first multiple calculation elements 111, 121, 211, 221, ..., k11, and k21 and the second multiple calculation elements 112, 122, 212, 222, ..., n12, and n22.

The accumulate calculation unit 10S calculates the sum of the first output signals output from the first multiple calculation elements 111, 211, ..., k11, the second output signals output from the second multiple calculation elements 112, 212, ..., n12, and the third output signal output from the resistor 113W in the calculation period. Likewise, the accumulate calculation unit 20S calculates the sum of the first output signals output from the first multiple calculation elements 121, 221, ..., k21, the second output signals output from the second multiple calculation elements 122, 222, ..., n22, and the third output signal output from the resistor 123W in the calculation period.

However, in a case where the third input signals have not been input to the resistor 113W and the resistor 123W or the multiply-accumulate calculation element 1 does not include the resistor 113W and the resistor 123W, the accumulate calculation unit 10S calculates the sum of the first output signals output from the first multiple calculation elements 111, 211, ..., k11 and the second output signals output from the second multiple calculation elements 112, 212, ..., n12 in the calculation period. This equally applies to the accumulate calculation unit 20S.

Figure 5:
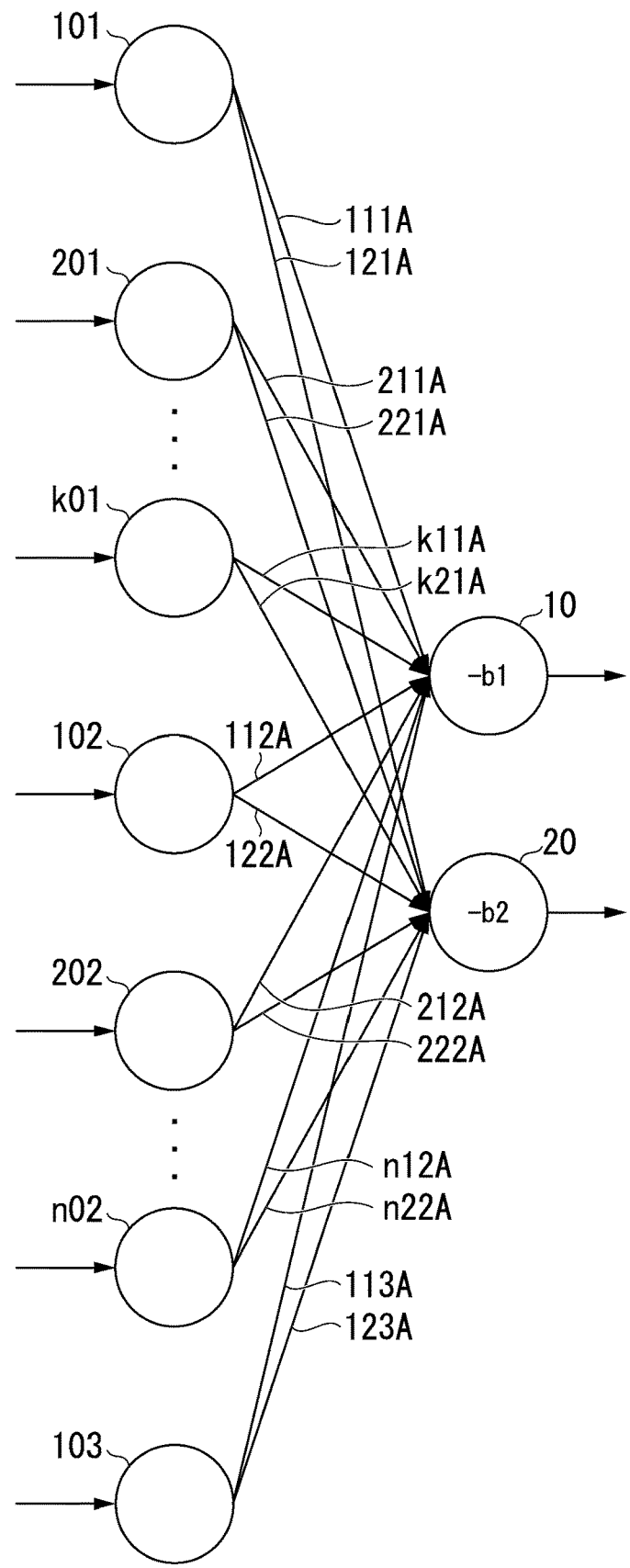
FIG. 5 is a diagram for describing an example of arithmetic operations of a neural network executed by the multiply-accumulate calculation device according to an embodiment.

Next, an example of arithmetic operations of a neural network executed by the multiply-accumulate calculation device according to an embodiment will be described with reference to FIG. 5. FIG. 5 is a diagram for describing an example of arithmetic operations of a neural network executed by the multiply-accumulate calculation device according to an embodiment.

Nodes 101, 201, ..., k01, 102, 202, ..., n02, and 103 form an input layer. Perceptrons 10 and 20 form a hidden layer or an output layer.

The node 101 corresponds to the first input unit 101E illustrated in FIG. 1 and FIG. 3 and outputs an input value corresponding to a first input signal to the perceptrons 10 and 20. Likewise, the nodes 201, ..., k01 respectively correspond to the first input units 201E, ..., k01E and output input values corresponding to first input signals to the perceptrons 10 and 20.

The node 102 corresponds to the second input unit 102E illustrated in FIG. 1 and FIG. 3 and outputs an input value corresponding to a second input signal to the perceptrons 10 and 20. Likewise, the nodes 202, ..., k02 respectively correspond to the second input units 202E, ..., n02E and output input values corresponding to second input signals to the perceptrons 10 and 20.

The node 103 corresponds to the third input unit 103E illustrated in FIG. 1 and FIG. 3 and outputs an input value corresponding to a third input signal to the perceptrons 10 and 20.

An arrow 111A corresponds to the first multiple calculation element 111 and represents that the input value output from the node 101 is multiplied by a weight and a value corresponding to a first output signal is input to the perceptron 10. Likewise, an arrow 121A corresponds to the first multiple calculation element 121 and represents that the input value output from the node 101 is multiplied by a weight and a value corresponding to a first output signal is input to the perceptron 20. The same applies to arrows 211A, 221A, ..., k11A, and k21A.

An arrow 112A corresponds to the second multiple calculation element 112 and represents that the input value output from the node 102 is multiplied by a weight and a value corresponding to a second output signal is input to the perceptron 10. Likewise, an arrow 122A corresponds to the second multiple calculation element 122 and represents that the input value output from the node 102 is multiplied by a weight and a value corresponding to a second output signal is input to the perceptron 20. The same applies to arrows 212A, 222A, ..., n12A, and n22A.

An arrow 113A corresponds to the resistor 113W and represents that the input value output from the node 103 is multiplied by a weight determined by a resistance value and a value corresponding to a third output signal is input to the perceptron 10. Likewise, an arrow 123A corresponds to the resistor 123W and represents that the input value output from the node 103 is multiplied by a weight determined by a resistance value and a value corresponding to a third output signal is input to the perceptron 20.

The perceptron 10 outputs a value obtained by adding a bias "−b1" illustrated in FIG. 5 to the sum of the input values represented by the arrows 111A, 211A, . . . , k11A, the arrows 112A, 212A, . . . , n12A, and the arrow 113A. Likewise, the perceptron 20 outputs a value obtained by adding a bias "−b2" illustrated in FIG. 5 to the sum of the input values represented by the arrows 121A, 221A, . . . , k21A, the arrows 122A, 222A, . . . , n22A, and the arrow 123A.

In addition, the bias "−b1" includes a negative bias generated by at least one of the first multiple calculation elements 111, 211, . . . , k11 and may include a positive bias generated by at least one of the second multiple calculation elements 112, 212, . . . , n02 and the resistor 113W. This equally applies to the bias "−b2."

The multiply-accumulate calculation device 1 according to an embodiment has been described above. The multiply-accumulate calculation device 1 calculates the sum of first output signals in a calculation period including at least a part of transient responses caused by discharging from the parasitic capacitors 111C, 121C, 211C, 221C, . . . , k11C, and k21C. Accordingly, the multiply-accumulate calculation device 1 can generate negative charge corresponding to negative biases without additionally adding components to cause a complicated circuit configuration. In addition, the multiply-accumulate calculation device 1 can generate negative biases having large absolute values to generate negative biases in a wide range by using a large number of first multiple calculation elements or causing as many transient responses caused by discharging as possible to be included in a calculation period.

In addition, the first multiple calculation elements 111, 121, 211, 221, . . . , k11, and k21 may be variable resistance elements or tunnel magnetoresistance effect elements having write terminals, common terminals, and read terminals. Accordingly, the multiply-accumulate calculation device 1 can generate negative biases having large absolute values to generate negative biases in a wide range because parasitic capacitors of a variable resistance element and a tunnel magnetoresistance effect element have large capacitances.

In addition, since the second multiple calculation elements 112, 122, 212, 222, . . . , n12, and n22 generate positive charge corresponding to desired positive biases, the multiply-accumulate calculation device 1 can calculate the sum of the aforementioned negative biases and the positive biases and adjust a bias in a wide range from positive to negative values.

Furthermore, since the resistor 113W and the resistor 123W generate positive charge corresponding to desired positive biases, the multiply-accumulate calculation device 1 can calculate the sum of the aforementioned negative biases and the positive biases and adjust a bias in a wide range from positive to negative values. In addition, the resistor 113W can generate a positive bias having a larger absolute value than the sum of positive biases generated by the second multiple calculation elements 112, 212, . . . , n12. Likewise, the resistor 123W can generate a positive bias having a larger absolute value than the sum of positive biases generated by the second multiple calculation elements 122, 222, . . . , n22. Accordingly, the multiply-accumulate calculation device 1 can rapidly negate the aforementioned negative biases with the positive bias generated by at least one of the resistor 113W and the resistor 123W to adjust a bias in a wide range from positive to negative values.

In addition, the above-described multiply-accumulate calculation device 1 can be used as a component of a neuromorphic device.

In addition, processing may be performed by recording a program for realizing the function of each device such as the multiply-accumulate calculation device 1 according to the above-described embodiment in a computer-readable recording medium and causing a computer system to read and execute the program recorded in this recording medium.

Meanwhile, the computer system mentioned here may include an operating system (OS) or hardware such as peripheral devices. In addition, the computer-readable recording medium may also include, for example, writable nonvolatile memories such as a floppy disk, a magneto-optical disk, a read only memory (ROM) and a flash memory, a portable medium such as a digital versatile disc (DVD), a storage device such as a hard disk embedded in a computer system, and a recording medium that holds a program for a specific time, such as a volatile memory in a computer system serving as a server or a client in a case where the program is transmitted through a network or a communication circuit.

In addition, the aforementioned program may be transmitted from a computer system in which this program is stored in a storage device or the like to another computer system through a transmission medium or according to transmitted waves in the transmission medium. Here, the transmission medium that carries the program refers to a medium having a function of transmitting information, such as a network such as the Internet or a communication circuit such as a telephone circuit.

Furthermore, the aforementioned program may be a program for realizing some of the above-described functions or a program which can realize the above-described functions according to a combination with a program already recorded in a computer system, that is, a so-called a difference program. The aforementioned program may be read and executed by a processor such as a central processing unit (CPU) included in a computer, for example.

The above-described multiply-accumulate calculation device or a neuromorphic device using the same can serve as various sensors or brains of robots. When a signal output from a sensor is input to a control apparatus using this neuromorphic device, the neuromorphic device can serve as an edge element. A sensor signal generally includes a large amount of noise, and a desired sensor signal cannot be extracted from noise in a general sensor module. Accordingly, a method of removing noise from a time-series signal that is a sensor signal, for example, using a signal processing technique to extract a desired signal, and the like are employed. In this case, the part other than the obtained signal only consumes energy and does not have information. It is possible to perform recognition with high accuracy by inputting a sensor signal to a control apparatus using this neuromorphic device. Although a conventional technology separates an observation signal in which a source signal and noise overlap into the source signal and the noise to extract the source signal as meaningful information, when this control apparatus is used, a desired source signal can be predicted from a time-series signal including noise and thus the original signal can be extracted as meaningful signal even if the output intensity or statistics of the source signal are low. This can be realized by an AI edge sensor module that is a module in which a sensor and a control apparatus are integrated. When this control apparatus is used, it is possible to extract information using a fewer calculation function than those of conventional technologies because recognition accuracy increases, and thus reduce costs, power consumption, and volume.

It is also desirable that signals of a plurality of sensors are simultaneously input to this control apparatus. It is possible to obtain recognition pertaining to relation between the sensors by simultaneously inputting the signals of the plurality of sensors. For example, when sensors are provided at hands, feet, and the body of a robot and signals from the sensors are simultaneously input to this control apparatus, it is possible to determine information such as whether the robot is walking or falls down according to the signals in a complex manner. Further, in a robot, a vehicle, or the like in which a plurality of AI edge sensor modules are provided, it is possible to expect lower power consumption and higher functionality by simultaneously inputting signals to this control apparatus. In a case where a plurality of sensors are different types of sensors, it is necessary to provide a control apparatus coping with voltages and currents that can correspond to the respective sensors. In this case, a transformer, an analog-digital converter, and the like are necessary for an interface of the control apparatus and thus energy is consumed according to energy conversion. Although an AI edge sensor module consumes energy in the same manner, a signal output from the AI edge sensor module to a central control apparatus is a signal on which specific recognition and identification has been performed in the AI edge sensor module and thus only necessary information can be transmitted. Since it is possible to reduce communication between the AI edge sensor module and the central control apparatus according to these functions, energy consumption in the entire system can be reduced.

Although an embodiment of the present disclosure has been described in detail with reference to the drawings, a specific configuration is not limited to the embodiment and various modifications and substitutions can be made without departing from essential characteristics of the present disclosure. The configurations described in the above-described respective embodiments may be combined.

INDUSTRIAL APPLICABILITY

According to the present disclosure, it is possible to improve the accuracy of results in a case where multiply-accumulate calculation is performed using neuromorphic elements.

REFERENCE SIGNS LIST

1 Multiply-accumulate calculation device
101E, 201E, k01E First input unit
111, 121, 211, 221, k11, k21 First multiple calculation element
111C, 121C, 211C, 221C, k11C, k21C Parasitic capacitor
111P, 121P, 211P, 221P, k11P, k21P Parasitic resistor
111R, 121R, 211R, 221R, k11R, k21R Variable resistor
111W, 121W, 211W, 221W, k11W, k21W Wiring resistor
111X, 121X, 211X, 221X, k11X, k21X Read terminal
111Y, 121Y, 211Y, 221Y, k11Y, k21Y Common terminal
111Z, 121Z, 211Z, 221Z, k11Z, k21Z Write terminal
102E, 202E, n02E Second input unit
112, 122, 212, 222, n12, n22 Second multiple calculation element
112C, 122C, 212C, 222C, n12C, n22C Parasitic capacitor
112P, 122P, 212P, 222P, n12P, n22P Parasitic resistor
112R, 122R, 212R, 222R, n12R, n22R Variable resistor
112W, 122W, 212W, 222W, n12W, n22W Wiring resistor
112X, 122X, 212X, 222X, n12X, n22X Read terminal
112Y, 122Y, 212Y, 222Y, n12Y, n22Y Common terminal
112Z, 122Z, 212Z, 222Z, n12Z, n22Z Write terminal
103E Third input unit
113W, 123W Resistor
10S, 20S Accumulate calculation unit
1111 Magnetization fixed layer
1112 Nonmagnetic layer
1113 First region
1114 Magnetic domain wall
1115 Second region
1116 First magnetization supply layer
1117 Second magnetization supply layer
4 Tunnel magnetoresistance effect element
41 First ferromagnetic layer
42 Second ferromagnetic layer
43 Tunnel barrier layer
T, T0, T1, T2, T3 First output signal
TF0, TF1, TF2, TF3, TS0, TS1, TS2, TS3 Transient response
10, 20 Perceptron
101, 102, 103, 201, 202, k01, n02 Node
111A, 112A, 113A, 121A, 122A, 123A, 211A, 212A, 221A, 222A, k11A, k21A, n12A, n22A Arrow

The invention claimed is:

1. A multiply-accumulate calculation device comprising:
a plurality of first multiple calculation elements each including a variable resistor and a parasitic capacitor, the parasitic capacitors of the plurality of first multiple calculation elements causing transient responses when being charged and transient responses when discharging, the plurality of first multiple calculation elements being configured to generate a weight according to a resistance value of each variable resistor and to generate first output signals by multiplying a first input signal corresponding to an input value by the weight and output the first output signals; and
an accumulate calculation unit connected to and receiving the first output signals generated by the plurality of first multiple calculation elements, the accumulate calculation unit being configured to calculate a sum of the first output signals output from the plurality of first multiple calculation elements in a calculation period from a point in time at which transition to a steady state has occurred after transient responses caused by charging to parasitic capacitors of the plurality of first multiple calculation elements according to input of the first input signal to a point in time after transient responses caused by discharging from the parasitic capacitors of the plurality of first multiple calculation elements according to input of the first input signal have started to be generated.

2. The multiply-accumulate calculation device according to claim 1, wherein each of the plurality of first multiple calculation elements is a variable resistance element having a write terminal, a common terminal, and a read terminal.

3. The multiply-accumulate calculation device according to claim 1, wherein each of the plurality of first multiple calculation elements is a tunnel magnetoresistance effect element.

4. The multiply-accumulate calculation device according to claim 1, further comprising at least one second multiple calculation element configured to generate a second output signal by multiplying a second input signal used to generate a positive bias by a weight and outputs the second output signal,
   wherein the accumulate calculation unit is configured to calculate a sum of the first output signals output from the plurality of first multiple calculation elements and the second output signal output from the at least one second multiple calculation element.

5. The multiply-accumulate calculation device according to claim 1, further comprising a resistor which receives a third input signal and outputs a third output signal to the accumulate calculation unit on the basis of the third input signal,
   wherein the accumulate calculation unit is configured to calculate a sum of the first output signals output from the plurality of first multiple calculation elements and the third output signal output from the resistor in the calculation period.

6. The multiply-accumulate calculation device according to claim 1, further comprising:
   at least one second multiple calculation element configured to generates a second output signal by multiplying a second input signal by a weight and outputs the second output signal; and
   a resistor which receives a third input signal and outputs a third output signal to the accumulate calculation unit on the basis of the third input signal,
   wherein the accumulate calculation unit is configured to calculate a sum of the first output signals output from the plurality of first multiple calculation elements, the second output signals output from the plurality of second multiple calculation elements, and the second output signal output from the at least one second multiple calculation element in the calculation period.

7. A neuromorphic device comprising the multiply-accumulate calculation device according to claim 1.

8. A multiply-accumulate calculation method of the multiply-accumulate calculation device according to claim 1, comprising:
   a multiple calculation process in which the plurality of first multiple calculation elements generate the first output signals by multiplying the first input signal by a weight and output the first output signals; and
   an accumulate calculation process in which the accumulate calculation unit calculates a sum of the first output signals output from the plurality of first multiple calculation elements in the calculation period from a point in time at which transition to a steady state has occurred after transient responses caused by charging to the parasitic capacitors of the plurality of first multiple calculation elements according to input of the first input signal to a point in time after transient responses caused by discharging from the parasitic capacitors of the plurality of first multiple calculation elements according to input of the first input signal have started to be generated.

9. The multiply-accumulate calculation device according to claim 2, further comprising at least one second multiple calculation element configured to generates a second output signal by multiplying a second input signal used to generate a positive bias by a weight and outputs the second output signal,
   wherein the accumulate calculation unit is configured to calculate a sum of the first output signals output from the plurality of first multiple calculation elements and the second output signal output from the at least one second multiple calculation element.

10. The multiply-accumulate calculation device according to claim 3, further comprising at least one second multiple calculation element configured to generates a second output signal by multiplying a second input signal used to generate a positive bias by a weight and outputs the second output signal,
    wherein the accumulate calculation unit is configured to calculate a sum of the first output signals output from the plurality of first multiple calculation elements and the second output signal output from the at least one second multiple calculation element.

11. The multiply-accumulate calculation device according to claim 2, further comprising a resistor which receives a third input signal and outputs a third output signal to the accumulate calculation unit on the basis of the third input signal,
    wherein the accumulate calculation unit is configured to calculate a sum of the first output signals output from the plurality of first multiple calculation elements and the third output signal output from the resistor in the calculation period.

12. The multiply-accumulate calculation device according to claim 3, further comprising a resistor which receives a third input signal and outputs a third output signal to the accumulate calculation unit on the basis of the third input signal,
    wherein the accumulate calculation unit is configured to calculate a sum of the first output signals output from the plurality of first multiple calculation elements and the third output signal output from the resistor in the calculation period.

13. The multiply-accumulate calculation device according to claim 2, further comprising:
    at least one second multiple calculation element configured to generates a second output signal by multiplying a second input signal by a weight and outputs the second output signal; and
    a resistor which receives a third input signal and outputs a third output signal to the accumulate calculation unit on the basis of the third input signal,
    wherein the accumulate calculation unit is configured to calculate a sum of the first output signals output from the plurality of first multiple calculation elements, the second output signals output from the plurality of second multiple calculation elements, and the second output signal output from the at least one second multiple calculation element in the calculation period.

14. The multiply-accumulate calculation device according to claim 3, further comprising:
    at least one second multiple calculation element configured to generates a second output signal by multiplying a second input signal by a weight and outputs the second output signal; and
    a resistor which receives a third input signal and outputs a third output signal to the accumulate calculation unit on the basis of the third input signal,
    wherein the accumulate calculation unit is configured to calculate a sum of the first output signals output from the plurality of first multiple calculation elements, the second output signals output from the plurality of second multiple calculation elements, and the second output signal output from the at least one second multiple calculation element in the calculation period.

15. A multiply-accumulate calculation device comprising:
a plurality of first multiple calculation elements, each of the plurality of first multiple calculation elements being a variable resistance element having a write terminal, a common terminal, a read terminal, a variable resistor and a parasitic capacitor, the parasitic capacitors of the plurality of first multiple calculation elements causing transient responses when being charged and transient responses when discharging, the plurality of first multiple calculation elements being configured to generate a weight according to a resistance value of each variable resistor and to generate first output signals by multiplying a first input signal corresponding to an input value by the weight and output the first output signals through the common terminals, the first input signal being input to the read terminal of at least one of the plurality first multiple calculation elements; and
an accumulate calculation unit connected to and receiving the first output signals generated by the plurality of first multiple calculation elements, the accumulate calculation unit being configured to calculate a sum of the first output signals output from the plurality of first multiple calculation elements in a calculation period from a point in time at which transition to a steady state has occurred after transient responses caused by charging to parasitic capacitors of the plurality of first multiple calculation elements according to input of the first input signal to a point in time after transient responses caused by discharging from the parasitic capacitors of the plurality of first multiple calculation elements according to input of the first input signal have started to be generated.

16. A multiply-accumulate calculation device comprising:
a plurality of first multiple calculation elements, each of the plurality of first multiple calculation elements being a tunnel magnetoresistance effect element having a variable resistor and a parasitic capacitor, the parasitic capacitors of the plurality of first multiple calculation elements causing transient responses when being charged and transient responses when discharging, the plurality of first multiple calculation elements being configured to generate a weight according to a resistance value of each variable resistor and to generate first output signals by multiplying a first input signal corresponding to an input value by the weight and output the first output signals; and
an accumulate calculation unit connected to and receiving the first output signals generated by the plurality of first multiple calculation elements, the accumulate calculation unit being configured to calculate a sum of the first output signals output from the plurality of first multiple calculation elements in a calculation period from a point in time at which transition to a steady state has occurred after transient responses caused by charging to parasitic capacitors of the plurality of first multiple calculation elements according to input of the first input signal to a point in time after transient responses caused by discharging from the parasitic capacitors of the plurality of first multiple calculation elements according to input of the first input signal have started to be generated.

* * * * *